United States Patent
Adest

(10) Patent No.: US 11,606,061 B2
(45) Date of Patent: Mar. 14, 2023

(54) INTEGRATED PHOTOVOLTAIC PANEL CIRCUITRY

(71) Applicant: Solaredge Technologies Ltd., Herzeliya (IL)

(72) Inventor: Meir Adest, Modiin (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 17/496,883

(22) Filed: Oct. 8, 2021

(65) Prior Publication Data

US 2022/0103121 A1  Mar. 31, 2022

Related U.S. Application Data

(60) Continuation of application No. 16/113,593, filed on Aug. 27, 2018, now Pat. No. 11,177,768, which is a division of application No. 13/487,311, filed on Jun. 4, 2012, now Pat. No. 10,115,841.

(51) Int. Cl.
*H02S 40/34* (2014.01)
*H01L 31/04* (2014.01)
*H02S 40/36* (2014.01)
*H01L 31/02* (2006.01)
*H02J 1/10* (2006.01)

(52) U.S. Cl.
CPC ........ *H02S 40/34* (2014.12); *H01L 31/02021* (2013.01); *H01L 31/04* (2013.01); *H02S 40/36* (2014.12); *H02J 1/10* (2013.01); *Y02E 10/50* (2013.01); *Y10T 29/49117* (2015.01)

(58) Field of Classification Search
CPC .................................. H02S 40/34; H02S 40/36
See application file for complete search history.

(56) References Cited

U.S. PATENT DOCUMENTS

| 4,945,255 A | 7/1990 | Suzuki et al. |
| 9,000,714 B2 | 4/2015 | Mun et al. |
| 2002/0196642 A1 | 12/2002 | Goder et al. |
| 2008/0143188 A1 | 6/2008 | Adest et al. |

(Continued)

FOREIGN PATENT DOCUMENTS

| CN | 1503379 A | 6/2004 |
| CN | 101752877 A | 6/2010 |

(Continued)

OTHER PUBLICATIONS

Mar. 2, 2021—CN Office Action—CN 201810409651.4.

*Primary Examiner* — Adi Amrany
(74) *Attorney, Agent, or Firm* — Banner & Witcoff, Ltd.

(57) ABSTRACT

A photovoltaic module is presented, which may include a photovoltaic panel and a converter circuit having a primary input connected to the photovoltaic panel and a secondary output galvanically isolated from the primary input. The primary input may be connectible to multiple input terminals within a junction box and at least one of the input terminals may be electrically connected to a ground. The photovoltaic module may include multiple interconnected photovoltaic cells connected electrically to multiple connectors (for example bus-bars). The photovoltaic module may include input terminals operable for connecting to the connectors and an isolated converter circuit. The isolated converter circuit may include a primary input connected to the input terminals and a secondary output galvanically isolated from the primary input.

23 Claims, 8 Drawing Sheets

(56) References Cited

U.S. PATENT DOCUMENTS

| | | |
|---|---|---|
| 2010/0071744 A1 | 3/2010 | Peurach et al. |
| 2010/0133911 A1 | 6/2010 | Williams et al. |
| 2010/0231174 A1 | 9/2010 | Li et al. |
| 2011/0103118 A1 | 5/2011 | Serpa et al. |
| 2012/0104863 A1 | 5/2012 | Yuan |
| 2012/0223583 A1 | 9/2012 | Cooley et al. |

FOREIGN PATENT DOCUMENTS

| | | |
|---|---|---|
| CN | 101958555 A | 1/2011 |
| CN | 104319761 A | 1/2015 |
| JP | H04127581 A | 4/1992 |

INTEGRATED PHOTOVOLTAIC PANEL CIRCUITRY

RELATED APPLICATIONS

This application is a continuation of U.S. application Ser. No. 16/113,593, filed Aug. 27, 2018 which claims priority to U.S. application Ser. No. 13/487,311, filed Jun. 4, 2012, entitled "Integrated Photovoltaic Panel Circuitry", the entire contents of which are incorporated herein by reference.

BACKGROUND

A photovoltaic panel or a solar panel is an interconnected assembly of solar cells and is the basic component of a photovoltaic system.

Manufacturers of photovoltaic panels specify electrical characteristics which may include maximum rated power, open circuit voltage, short circuit current, maximum power voltage, maximum power current, temperature coefficients and insulation resistance.

Insulation resistance testing may be carried out by shorting a positive terminal and a negative terminal of a solar panel, and then by applying a predetermined voltage between the live electrical section and the outer housing, backside, the frame, and ground terminals. Wet insulation testing of photovoltaic panels may include performing resistance measurement on the insulation of a photovoltaic panel immersed in a liquid solution bath. The insulation resistance test and wet insulation test verifies that the solar panel or the solar cell array has insulation high enough to reduce the possibility of fire and electrocution hazards.

An increase in maximum system voltage may place an extra burden on photovoltaic manufacturers with regard to insulation resistance. Further, photovoltaic modules can exhibit performance degradation in the field when subjected to high voltages at elevated temperatures in a humid climate. Given that increased system voltage may place an extra burden on panel manufacturers to provide better insulation, and given that increased maximum system voltage may be a cause of performance degradation of photovoltaic modules, there is a need for and it would be advantageous to have circuitry integrated with a photovoltaic panel which provides features to allow more photovoltaic panels to be wired serially in a string without needing higher insulation resistance of the photovoltaic panel and lower operating voltage operation of photovoltaic panels so as to increase long term lifetime of a photovoltaic system.

SUMMARY

Various circuits are disclosed which are integrated or integrable with a photovoltaic panel to provide built-in functionality to the photovoltaic panel.

According to various aspects disclosed herein, there is provided a photovoltaic module which may include a photovoltaic panel and an isolated converter circuit with a primary input connected to the photovoltaic panel and a secondary output galvanically isolated from the primary input. The primary input may be connectible to multiple input terminals within a junction box and at least one of the input terminals may be electrically connected to a ground.

The photovoltaic module may include multiple interconnected photovoltaic cells connected electrically to multiple connectors (for example bus-bars). The photovoltaic module may include input terminals operable for connecting to the connectors and an isolated converter circuit. The isolated converter circuit may include a primary input connected to the input terminals and a secondary output galvanically isolated from the primary input. The isolated converter circuit may convert DC power on the primary input to a DC power on the secondary output. A duty cycle of the isolated converter circuit may be adjustable to give a nominal voltage on the secondary output. The duty cycle of the isolated converter circuit may be adjustable to give an adjustable open circuit voltage across the secondary output. The isolated converter circuit may be a Cuk circuit, a buck circuit, a buck-boost circuit, a buck and boost circuit, a boost circuit, a full-bridge circuit, a half-bridge circuit, a push-pull circuit, a resonant forward circuit, a forward circuit, a half-forward circuit, a ringing choke converter or a flyback circuit.

The photovoltaic module may be galvanically isolated from the primary input. The secondary output may be a dual direct-current (DC) output or a single direct-current (DC) output. The primary input may be a dual direct-current (DC) input from the connectors (for example bus-bars) or a single direct-current (DC) input from the connectors. Both the primary input and the secondary output may be dual direct-current (DC) input and output respectively or may be a single direct-current (DC) input and output respectively. The primary input and the secondary output may be a single direct-current (DC) input and a dual direct-current (DC) output respectively or may be a dual direct-current (DC) input and a single direct-current (DC) output respectively.

According to various aspects, there is provided a power harvesting system which includes multiple photovoltaic cells, and/or panels. Multiple isolated converter circuit modules with respective primary inputs, which may be integrable with and electrically connectable to respective photovoltaic panels. The power harvesting system may further include multiple interconnected photovoltaic strings. Each photovoltaic string may be a series connection of secondary outputs of the isolated converter circuit modules and the secondary outputs may be galvanically isolated from the primary inputs. A duty cycle of the isolated converter circuit modules may be adjustable to give an adjustable nominal voltage across the interconnected photovoltaic strings. A load may also be connected across the photovoltaic strings. The load may be a DC to alternating current (AC) inverter, a three-level DC to AC inverter, a grid tied DC to AC inverter, a DC battery, a DC motor or a DC to DC converter input.

According to various aspects, there is provided a method to reduce the voltage rating of a serial connection of photovoltaic panels in a solar power harvesting system. The method connects multiple primary input terminals of respective power converters to the connectors (for example bus-bars) of respective photovoltaic panels. Multiple secondary output terminals of the power converters are connected together to provide the serial connection. The secondary output terminals are galvanically isolated from the primary input terminals.

According to various aspects, there is provided a method for providing an adjustable open circuit voltage at the output terminals of a photovoltaic module. The method connects primary input terminals of a power converter to the connectors (for example bus-bars) of the photovoltaic panel. Power on the primary input terminals may be converted to an output power on secondary output terminals of the power converter. A duty cycle of the power converter may be adjusted to set and adjust an open circuit voltage across the secondary output terminals.

DESCRIPTION OF THE DRAWINGS

Various embodiments are herein described, by way of example only, with reference to the accompanying drawings, wherein:

FIG. 2b which shows a plan view the photovoltaic panel shown in FIG. 2a.

DETAILED DESCRIPTION

Figure 1:
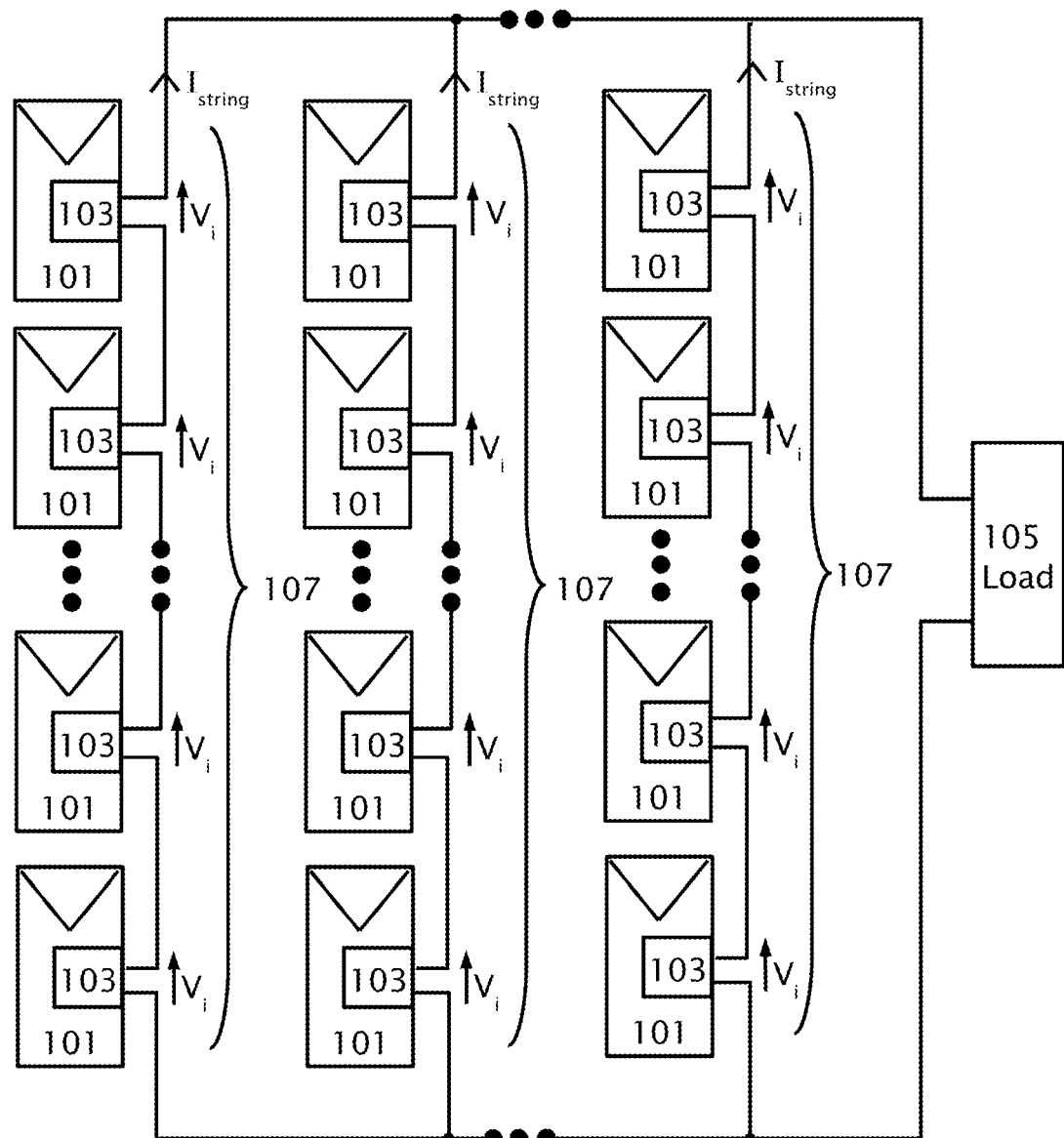
FIG. 1 illustrates a photovoltaic solar power harvesting system, illustrating features of various embodiments.

Reference will now be made in detail to features of various embodiments, examples of which are illustrated in the accompanying drawings, wherein like reference numerals refer to the like elements throughout. The features are described below to explain various embodiments by referring to the figures.

Before explaining various aspects in detail, it is to be understood that embodiments are not limited in their application to the details of design and the arrangement of the components set forth in the following description or illustrated in the drawings. Embodiments are capable of other features or of being practiced or carried out in various ways. Also, it is to be understood that the phraseology and terminology employed herein is for the purpose of description and should not be regarded as limiting.

It should be noted, that although the discussion herein relates primarily to photovoltaic systems, various embodiments may, by non-limiting example, alternatively be configured using other distributed power systems including (but not limited to) wind turbines, hydro turbines, fuel cells, storage systems such as battery, super-conducting flywheel, and capacitors, and mechanical devices including conventional and variable speed diesel engines, Stirling engines, gas turbines, and micro-turbines.

By way of introduction, various aspects are directed to circuitry integrated or integrable with a photovoltaic panel to form a photovoltaic module. The circuitry allows for galvanic isolation between the photovoltaic panel and the output of the circuitry.

According to an illustrative feature of various embodiments, the circuit is connected or connectible at the input terminals to a photovoltaic panel. The output terminals may be connected to form a string of photovoltaic modules. Multiple photovoltaic modules may be parallel connected to form the photovoltaic solar power harvesting system The term "switch" as used herein may refer in various embodiments to an active semiconductor switch, e.g. a field effect transistor (FET), in which a controllable and/or variable voltage or current is applied to a control terminal, e.g. gate, of the switch which determines the amount current flowing between the poles of the switch, e.g. source and drain of the FET.

The term "activate" a switch as used herein may refer to opening, closing and/or toggling i.e. alternatively opening and closing the switch.

The term "galvanic isolation" as used herein is a way of isolating functional sections of electrical circuits and/or systems from the movement of charge-carrying particles from one section of an electrical circuit and/or a system to another. That is, there is no direct current between the functional sections of electrical circuits and/or systems. Energy or information, however, can still be exchanged between the sections of electrical circuits and/or systems by other means, e.g. capacitance, mutual inductance or electromagnetic waves, or by optical, acoustic or mechanical means.

The term "dual DC" input or output may refer in various embodiments to positive and negative terminals referenced to each other and referenced to a third terminal, such as ground potential, electrical ground or a neutral of an alternating current (AC) supply which may be connected to electrical ground at some point.

The term "single DC" input or output refers to positive and negative terminals referenced to each other, but not referenced or connected to a ground potential, electrical ground or a neutral of an alternating current (AC) supply, unless one of the terminals is coupled to a reference.

The term "two-level inverter" as used herein, refers to and inverter having an AC phase output having two voltage levels with respect to a negative terminal. The negative terminal is common to the AC phase output and the direct current (DC) input of the two-level inverter. The alternating current (AC) phase output of the two-level inverter may be a single phase output a two phase output or a three phase output. Therefore, the single phase output has two voltage levels with respect to the negative terminal. The two phase output has two voltage levels with respect to the negative terminal for each of two phases. The three phase output has two voltage levels with respect to the negative terminal for each of three phases.

Similarly, the term "three-level inverter" as used herein refers to and inverter having an alternating current (AC) phase output having three voltage levels. The AC phase output has three voltage levels with respect to a negative terminal. The negative terminal may be common to the AC phase output and the direct current (DC) input of the three-level inverter. The alternating current (AC) phase output of the three-level inverter may be a single phase output, a two phase output, or a three phase output. Therefore, the single phase output has three voltage levels with respect to the negative terminal. The two phase output has three voltage levels with respect to the negative terminal for each of the two phases. The three phase output has three voltage levels with respect to the negative terminal for each of the three phases.

The three-level inverter compared with the two-level inverter may have a cleaner AC output waveform, may use smaller size magnetic components and may have lower losses in power switches, since more efficient lower voltage devices may be used. Three-level inverter circuits may have dual (positive and negative) direct current (DC) inputs.

Reference is now made to FIG. 1 of a photovoltaic solar power harvesting system 10, illustrating various aspects. Power harvesting system 10 includes multiple photovoltaic panels 101 connected respectively to multiple junction boxes 103 to form multiple photovoltaic modules. Junction box 103 may provide electrical input terminals and mechanical support for bus-bars a, b and c (not shown), which may be used as an input to junction box 103 from panel 101. Junction box 103 may be attachable and/or re-attachable to panel 101 or may be permanently attachable to panel 101 using for example a thermoset adhesive, e.g. an epoxy adhesive, screws, or other mechanical attachment. The electrical voltage outputs ($V_i$) at output terminals of junction boxes 103 may be connected in series to form a series photovoltaic serial string 107 through which a string current ($I_{string}$) may flow. Multiple strings 107 may be connected in parallel and across an input of a load 105. $V_i$ and $I_{string}$ may be different for every photovoltaic module and string 107, respectively. Load 105 may be a direct current (DC) load such as a DC motor, a battery, an input to a DC to DC converter, or a DC input to a DC to AC inverter.

Figure 2A:
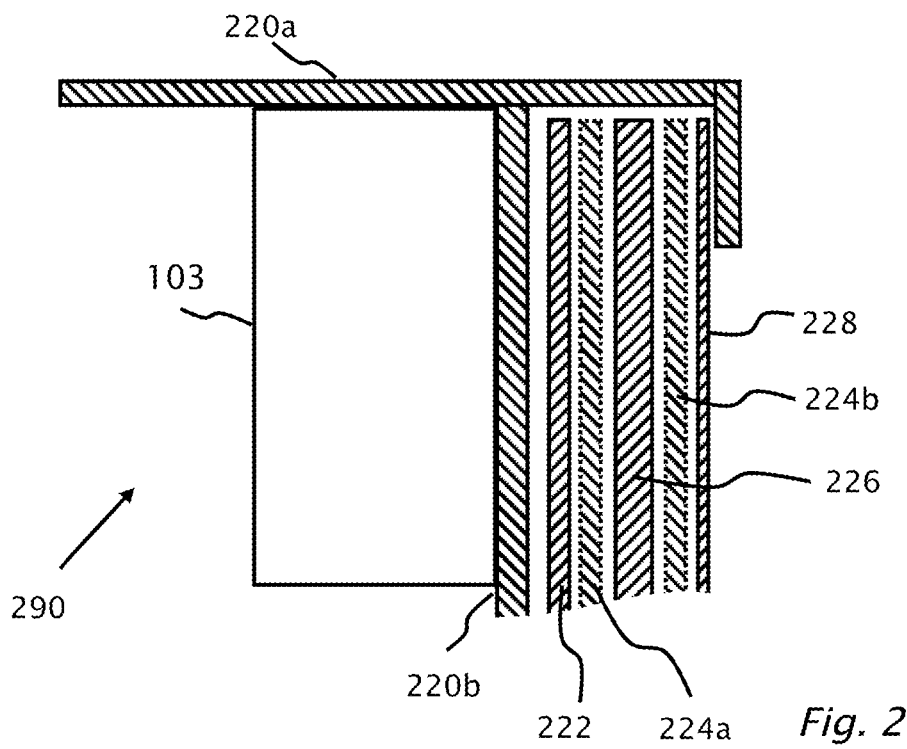
FIG. 2a shows a cross section of a photovoltaic panel.
Figure 2B:
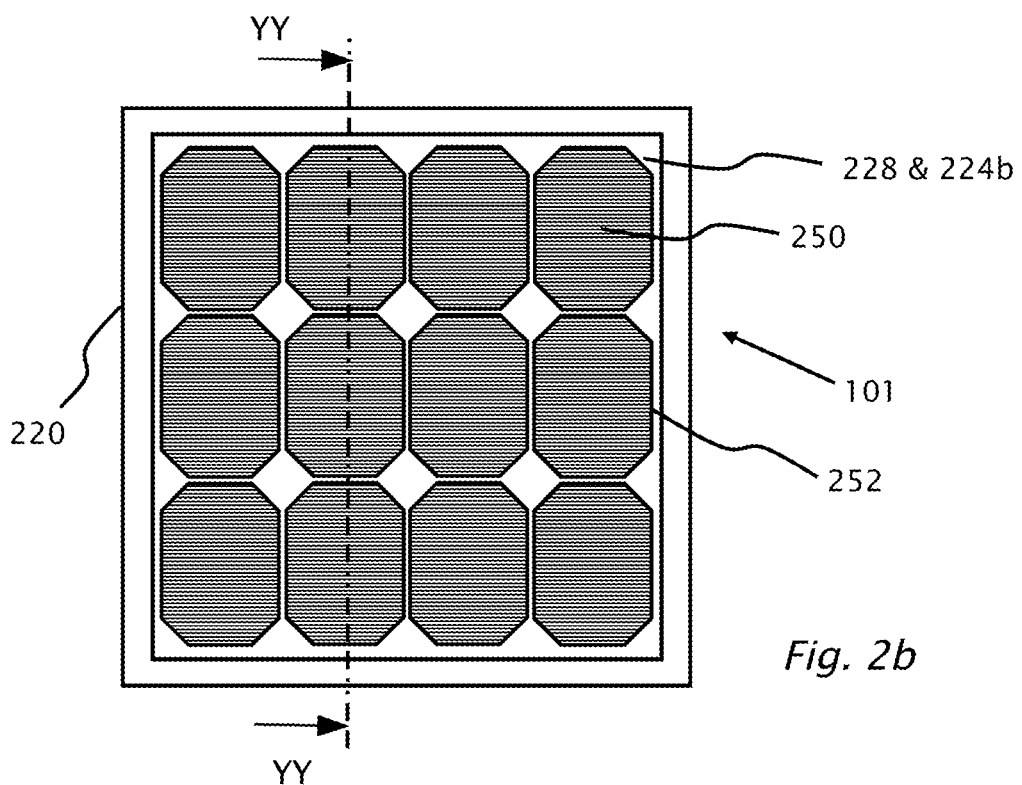

Reference is now made to FIG. 2b, which shows a plan view photovoltaic panel 101. The plan view shows casing 220 and photovoltaic cells 252 with tracks 250 showing through transparent glass 228 and sheet 224b.

Reference is now made to FIG. 2a which shows a partial cross section 290 of section YY shown in FIG. 2b for a photovoltaic panel 101. The partial cross section is located near a side 220a of casing 220. Side 220a is located at the perimeter of casing 220 as illustrated in FIG. 2b. Casing 220 includes a back 220b and four sides 220a. Casing 220 may be fabricated using a metal alloy, aluminum, stainless steel, plastic or other material having sufficient strength to house the panel components. Casing 220 may hold together a sandwich of various sheets. Nearest to back 220b is an insulating sheet 222. Next to insulating sheet 222 is a reactive encapsulant sheet 224a. Encapsulant sheet 224a may be made from a polymer, e.g., ethylene vinyl acetate (EVA) polymer, polyvinyl-butyral (PVB), etc. Next to reactive encapsulant sheet 224a is a photovoltaic substrate 226 followed by another reactive encapsulant sheet 224b, that may be transparent. Encapsulant sheet 224b may be made out of the same or similar material as 224a. Finally after reactive encapsulant sheet 224b is a sheet of low iron flat glass 228. The side (i.e., surface) of photovoltaic substrate 226 adjacent to reactive encapsulant sheet 224b is where the metal tracks 250 (not shown) may be located. Metal tracks 250 connect electrically the photovoltaic cells 252 (not shown) of photovoltaic substrate 226. Junction box 103 may be mounted on back 220b and bus-bars a, b and c (not shown) may terminate inside junction box 103 and connect to tracks 250. In other embodiments, junction box 103 is mounted separate from panel 101.

Figure 3A:
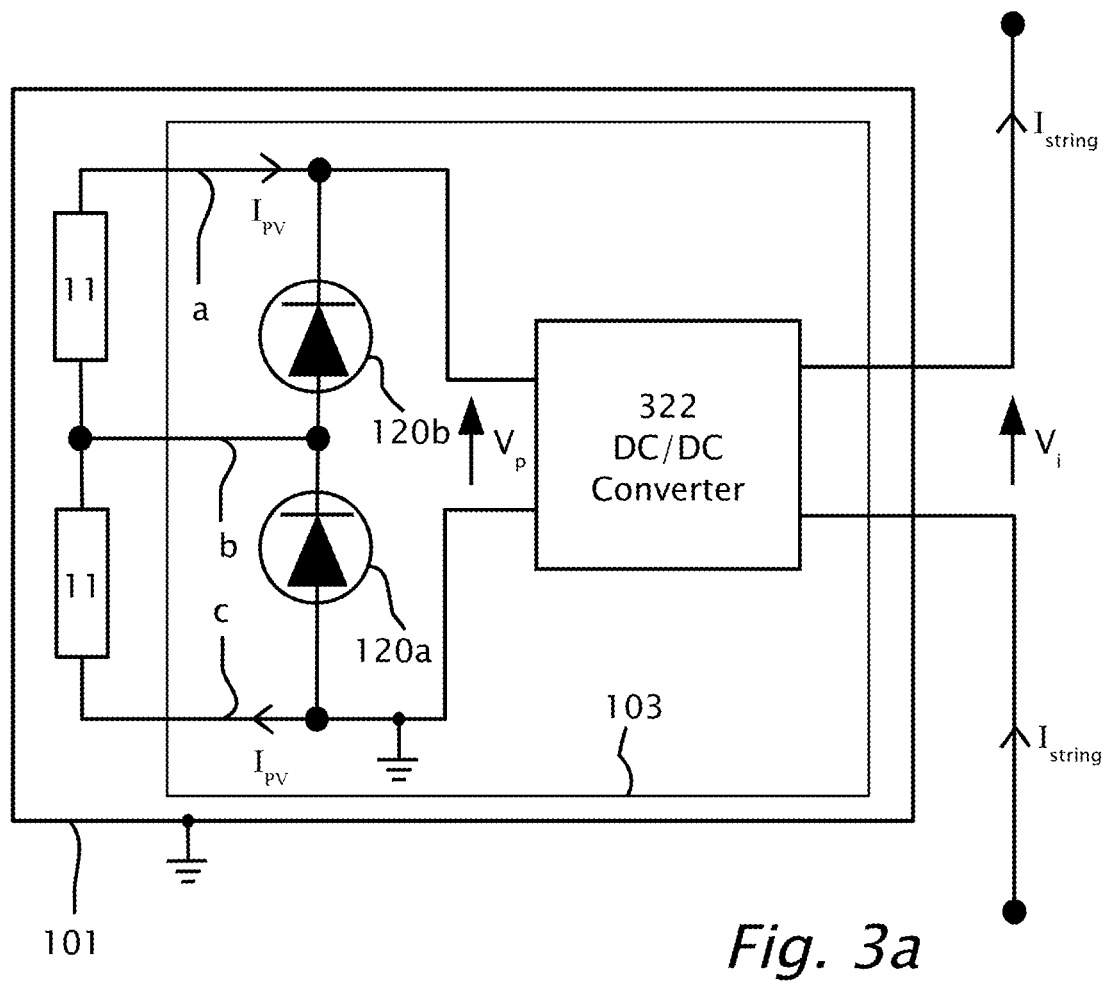
FIG. 3a shows details of a circuit and a photovoltaic panel shown in FIG. 1, according to an illustrative embodiment.

Reference is now made to FIG. 3a which shows more details of junction box 103 and photovoltaic panel 101 shown in FIG. 1, according to an illustrative feature. According to the example, photovoltaic panel 101 includes two sub-strings 11 of serially connected photovoltaic cells which output to bus-bars a, b and c which are the input terminals to junction box 103. Sub-strings 11 may include one or more cells. The input of junction box 103 may include two bypass diodes 120a and 120b with anodes connected respectively to bus-bars c and b and cathodes connected respectively to bus-bars a and b. Connected across bus-bars a and c is the input to a direct current (DC) to DC converter 322. When sub-strings 11 are illuminated, the current into converter 322 is substantially that of current $I_{PV}$ flowing from strings 11 and the voltage $V_P$ input to converter 322 is the voltage across bus-bars a and c. The output of converter 322 is $V_i$ and the output of a converter 322 may be placed in series with other panels 101 and/or junction boxes 103 to form a string 107 as shown in FIG. 1.

Figure 3B:
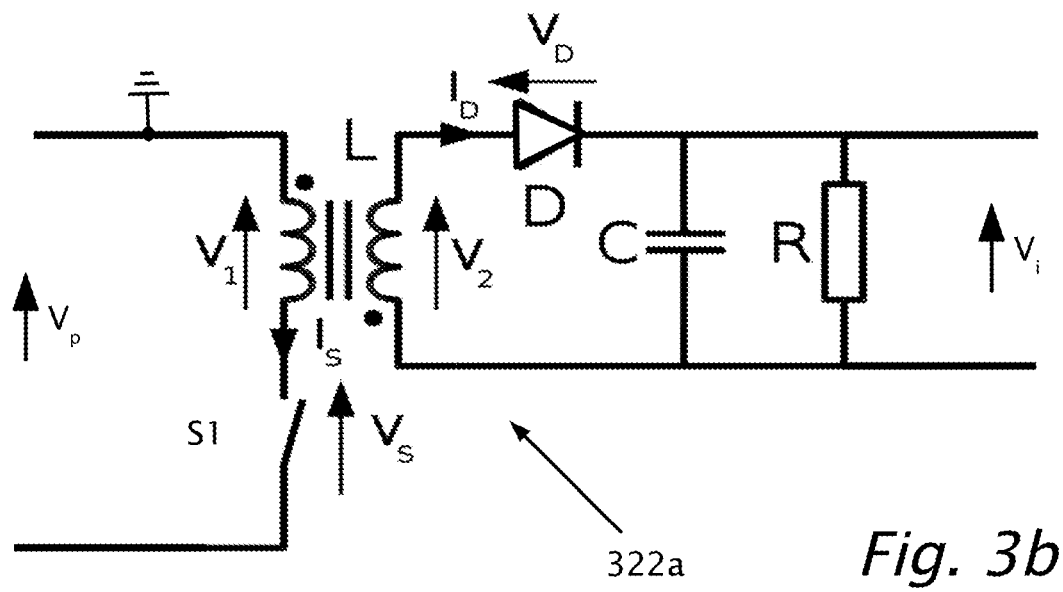
FIGS. 3b and 3c show two illustrative circuits for a DC/DC converter shown in FIG. 3a which are operable by a controller.
Figure 3C:
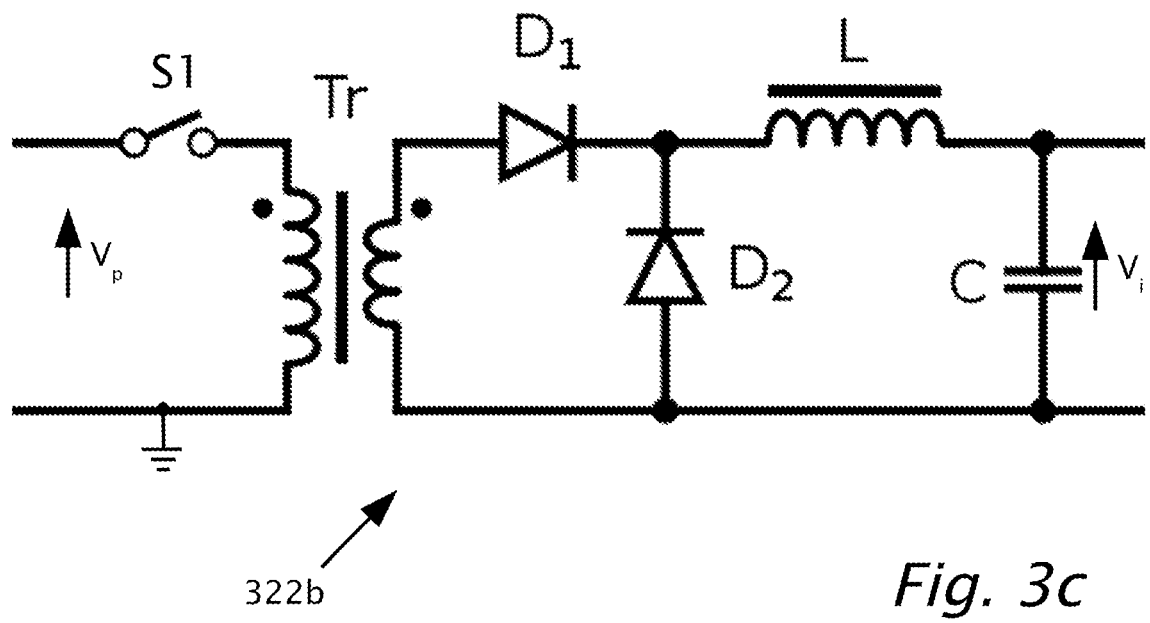

Reference is now made to FIGS. 3b and 3c which show implementations of converter 322 shown in FIG. 3a, according to various embodiments. Both FIGS. 3b and 3c are isolating DC to DC converters shown by converter circuits 322a and 322b respectively. Converters 322a and 322b have primary inputs ($V_P$) which may be connected across a panel 101 as shown in FIG. 3a and secondary outputs ($V_i$) which may be connected in series to form a serial string 107 as shown in FIG. 1.

Converter 322a has a single switch S1 wired in series with a primary side of a mutual inductor L. The secondary side of inductor L is wired in series with a diode D. The anode of diode D may be connected to one end of inductor L and the cathode of diode D may be connected to the positive voltage terminal of secondary output Vi. The other end of inductor L not connected to diode D may be connected to the negative terminal of secondary output Vi. A resistor R and capacitor C may be wired in parallel across the secondary output $V_i$. In an alternate version, the cathode of diode D may be connected to one end of inductor L, the anode of diode D may be connected to the negative terminal of secondary output Vi, and the other end of inductor L not connected to diode D may be connected the positive terminal of secondary output Vi. A resistor R and capacitor C may be wired in parallel across secondary output $V_i$ in the alternate version.

Converter 322a may be an isolating buck-boost converter with the inductor (L) split to form a transformer, so that voltage ratios of $V_1$ and $V_2$ are multiplied as well as having galvanic isolation between primary input $V_P$ and secondary output $V_i$.

Converter 322b may have a single switch S1 wired in series with a primary side of a transformer Tr. Again transformer Tr provides galvanic isolation between primary input $V_P$ and secondary output $V_i$. One end of the secondary winding of transformer Tr may connect to the anode of a diode D1 and the cathode of D1 may connect to one end of an inductor L. The other end of inductor L may be connected to the positive voltage terminal of secondary output $V_i$. The other end of the secondary winding may be connected to the negative voltage terminal of secondary output $V_i$. The other end of the secondary winding may connect to the anode of diode D2 and the cathode of D2 may connect to the cathode of diode D1. A capacitor C may be connected across secondary output $V_i$. Other variation of converter 322b may be used with D1, D2, L and C used in various other arrangements to provide the same output $V_i$. Converter 322b may be a forward converter and performs the same function of converter 322a and may be more energy efficient than converter 322a. Numerous other isolated DC to DC converter topologies may be used with respect to converter 322, for example, ringing choke converter, resonant forward, half-bridge and full-bridge converters. A feature of DC to DC converters may be an adjustable duty cycle for conversion of DC power. Converters 322a and 322b, therefore, may be adjusted to give an adjustable desired open circuit voltage across secondary output $V_i$ prior to connection in a string 107.

Figure 3D:
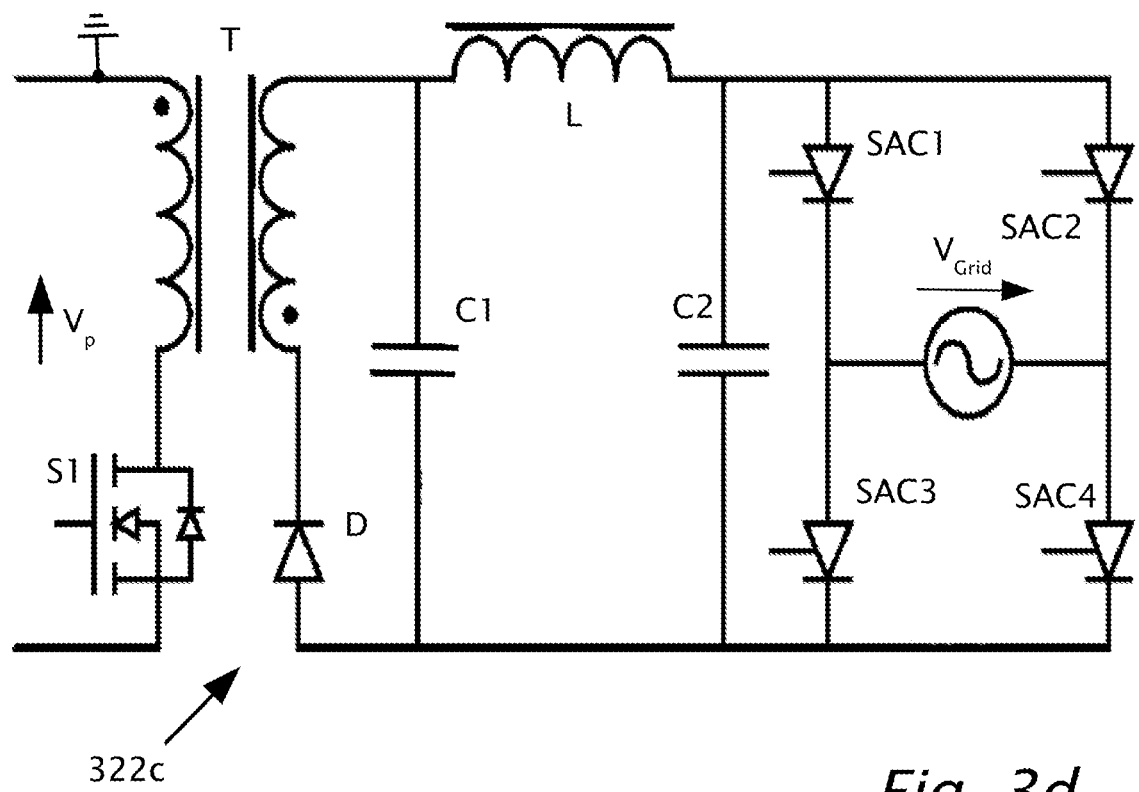
FIG. 3d shows an isolating DC to alternating current (AC) inverter, according to an illustrative embodiment.

Reference is now made to FIG. 3d which shows an isolating DC to alternating current (AC) isolating inverter 322c, according to an illustrative feature. A switch S1 may be wired in series with the primary side of a transformer T. In some variations, switch S1 may be a metal oxide semiconductor field effect transistor (MOSFET). A DC voltage ($V_P$) may be applied across the source of switch S1 and one side of primary coil T. The other side of primary coil T may be connected to the drain of switch S1. In some variations the source and drain of S1 may reversed. A diode D may be connected in series with the secondary coil with of transformer T with the cathode of D connected to one end of the coil. Connected across the series connection of the secondary coil of transformer T and diode D may be capacitor C1. One end of capacitor C1 may be connected to the anode of diode D and the other end of capacitor C1 may be connected to the end of the secondary coil not connected to the diode D. The end of the secondary coil not connected to diode D may also be connected to one end of an inductor L and the other end of inductor L connected to anodes of switch control rectifiers SAC1, SAC2 and one end of capacitor C2. The other end of capacitor C2 may connect to the anode of diode D and the cathodes of switch control rectifiers SAC3 and SAC4. The cathode of switch control rectifier SAC1 may connect to the anode of switch control rectifier SAC3 to form a first terminal of secondary AC output $V_{Grid}$. The cathode of switch control rectifier SAC2 may connect to the anode of switch control rectifier SAC4 to form a second terminal of secondary AC output $V_{Grid}$. Multiple secondary AC outputs ($V_{Grid}$) from multiple inverters 322c may be connected in either case to give a series AC string or in parallel to give a parallel AC string.

Converter circuits 322a, 322b and 322c may having one terminal of respective primary sides ($V_P$) connected to a ground and/or casings 220 of panels 101 which may also be connected to the ground. The ground may be electrical earth and/or a local earth provided in the immediate vicinity of panels 101. Further connections to electrical earth may be made by bonding to casings 220 of panels 101 and framework used to mount panels 101.

Figure 3E:
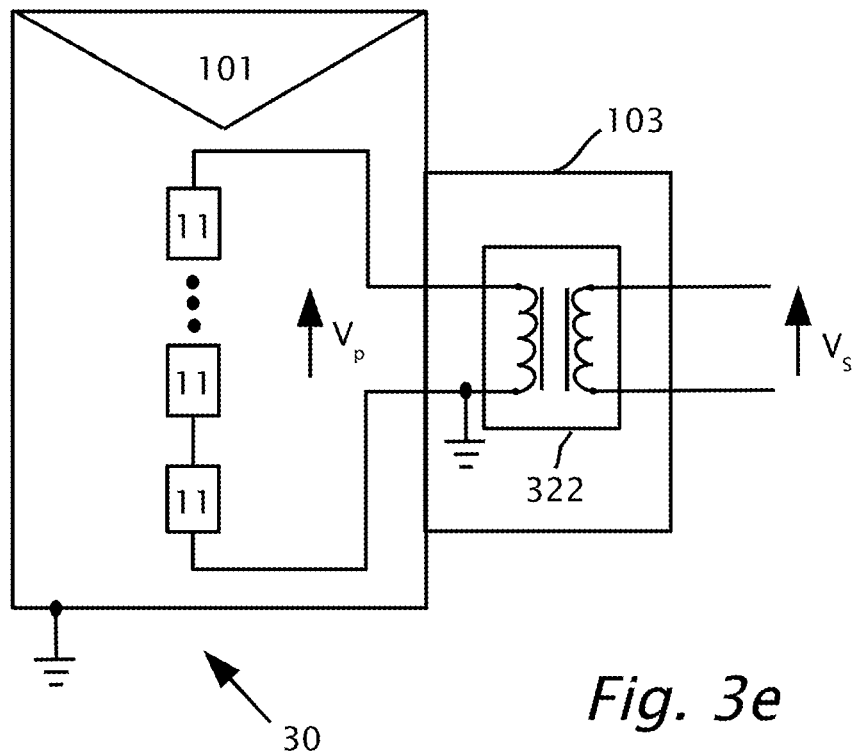
FIG. 3e which shows a photovoltaic module, according to an illustrative embodiment.

Reference is now made to FIG. 3e which shows a photovoltaic module 30, according to an illustrative feature. Photovoltaic module 30 includes one or more panels 101 series connected with sub-strings 11 which are in series and connected across the primary input ($V_P$) of an isolating converter 322. Converter 322 provides a secondary output ($V_S$) which may be galvanically isolated from the primary input ($V_P$). The secondary output ($V_S$) may be DC and/or AC. Circuitry of converter 322 may be integrated or integrable with a photovoltaic panel 101 and/or housed in a junction box 103.

Figure 4:
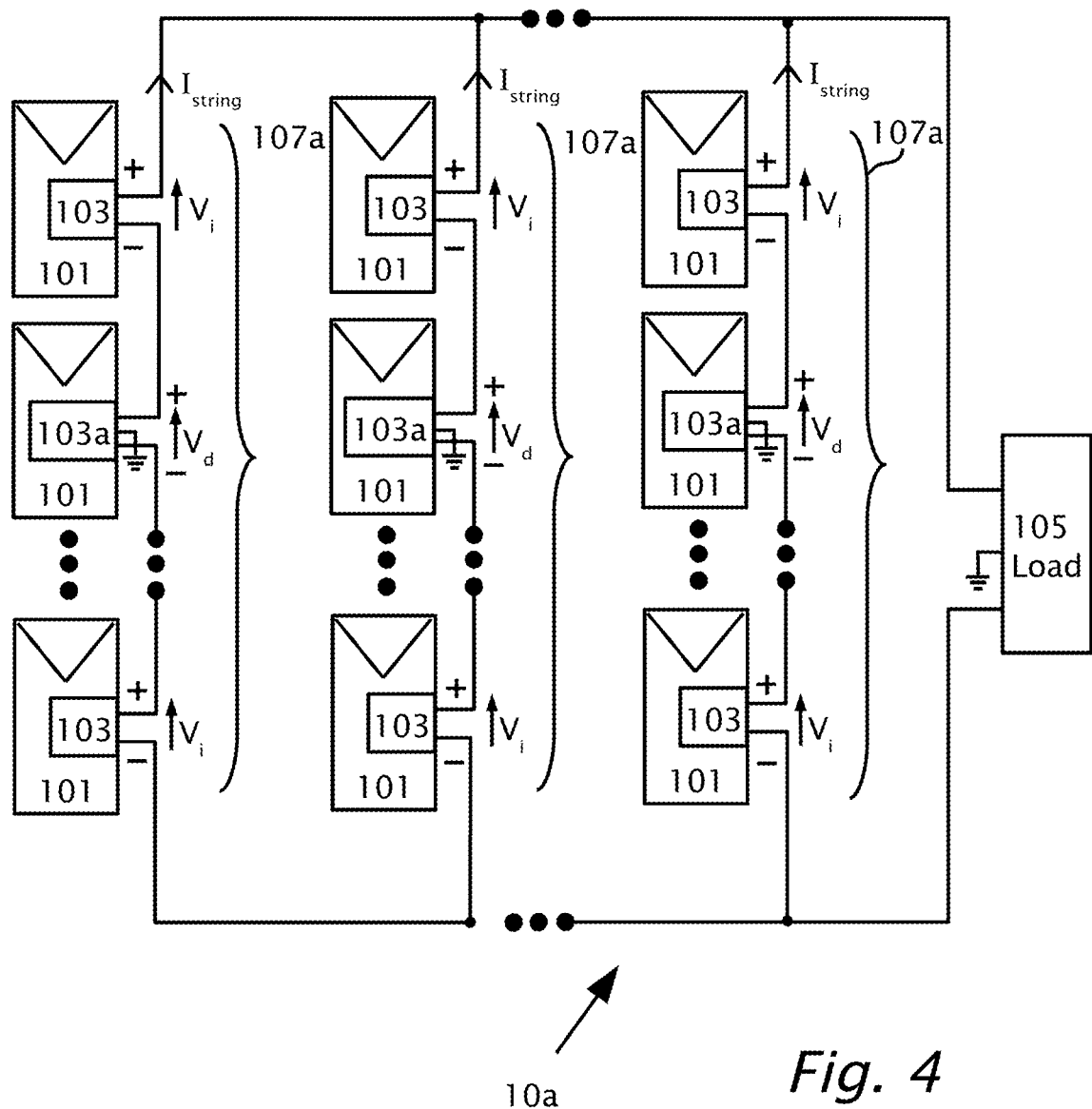
FIG. 4 shows an alternative photovoltaic solar power harvesting system, according to various aspects.
Figure 5:
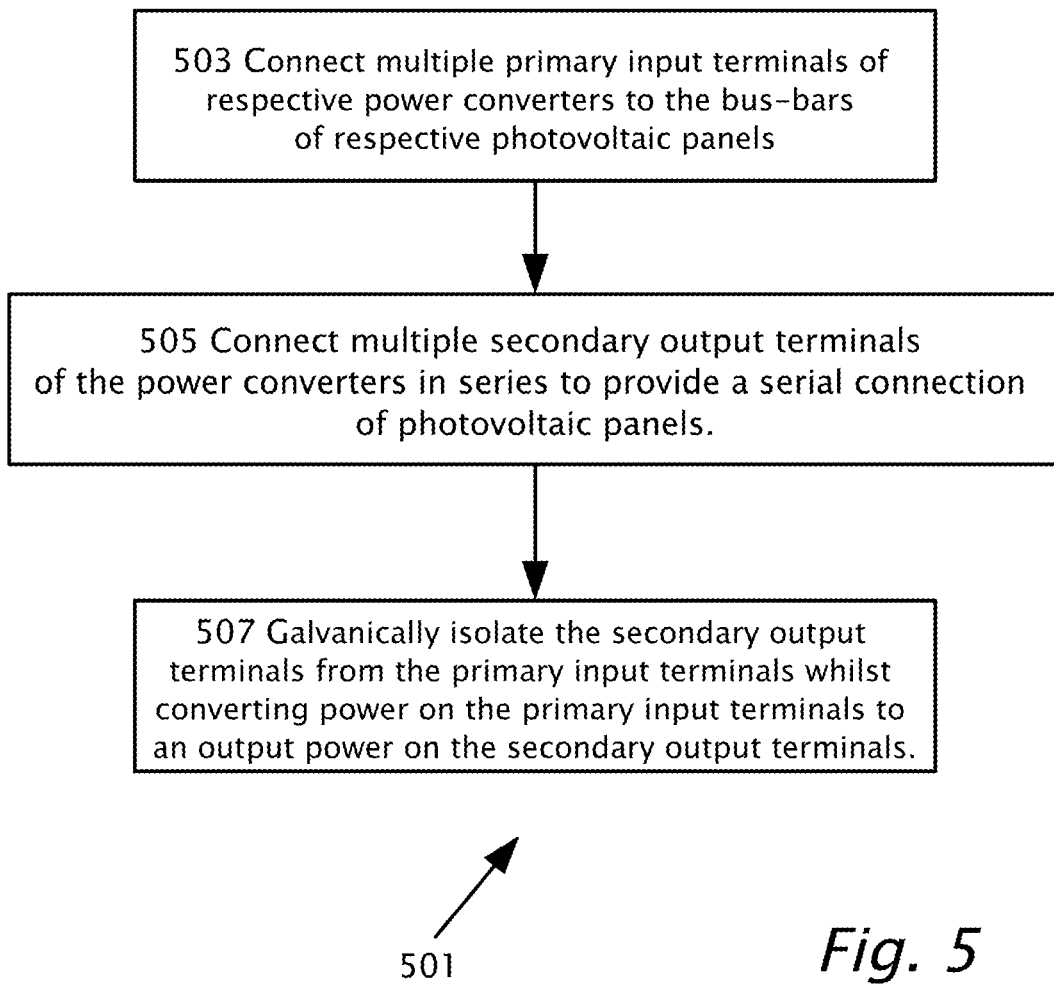
FIG. 5 which shows a method which may be applied to the system and junction boxes shown in FIG. 1, according to an illustrative feature.

Reference is now made to FIG. 5 which shows a method 501 which may be applied to system 10/10a and junction boxes 103, according to an illustrative feature as shown in FIGS. 1 and 4. With reference to FIG. 3a, in step 503, a single primary DC input ($V_P$) of converter 322 is connected to bus-bars a and c via terminations, which may be located in in junction box 103. Where converter 103 has a dual DC input, connection may be made to bus bar b. In the case of dual DC input into converter 322 bus bar b may be additionally connected to a local ground or electrical earth. Similar connections may be made in multiple converters 322 (which may be in respective multiple junction boxes 103) integrated with panels 101. In step 505, the outputs ($V_i$) of converters 322 may be wired in series to form a string 107 illustrated in FIG. 4. During the irradiation of strings 107 if an isolating converter 322 is used, in step 507, DC power on the primary input ($V_P$) may be converted with galvanic isolation to the secondary output ($V_i$). The galvanic isolation between primary input ($V_P$) and secondary output ($V_i$), may additionally allow for different ground potentials on either side of the primary input ($V_P$) and the secondary output ($V_i$). The galvanic isolation of different ground potentials, on either side of 322, may allow for use of various configurations of single or dual DC input and/or outputs on the primary inputs ($V_P$) and the secondary outputs ($V_i$) within string 107, since each $V_P$ may be isolated from every other $V_P$.

By way of numerical example, a comparison may be made between ten panels 101 having converters 322 in a string 107 and ten panels without converters 322 connected in a serial string. In the serial string the first panel 101 has the negative terminal connected to a ground and the chassis of the first panel 101 connected to the ground as well. The remaining nine panels 101 only have their respective chassis connected to the ground. If the output of each panel is 40 Volts, then the top tenth panel 101 has a voltage of 10 times 40V=400 Volts at its positive output terminal and the ninth panel has voltage of 9 times 40=360 Volts at its positive output terminal. By comparison in a string 107 using isolating converters, the primary side of the respective converters 322 have a ground connection as shown in FIG. 3e as well as the chassis of each respective panel 101 being connected to the ground as well. In such a string 107 with isolating converters 322, the primary side and hence the output of each panel 101 is at 40 Volts by virtue of the galvanic isolation between the primary side and the secondary side of each respective converter 322. The secondary sides of converters 322 in series string 107 still give 10 times 40V=400 Volts but each panel 101 in string 107 only operates at 40 Volts with respect to the ground. Therefore, the voltage rating of each panel 101 in a string 107 is only 40 Volts compared to the panels 101 in the serial string of panels 101. Panels 101 in the serial string may have to have a voltage rating of at least 400 Volts if the first panel 101 has the negative terminals connected to the ground and possibly a much greater rating of 400 Volts if the first panel 101 has the negative terminal not connected to the ground. The negative terminal not connected to the ground may allow the voltage of the serial string to float, so that the tenth panel 101 in the serial string may have a voltage greater than 400 Volts.

Figure 6:
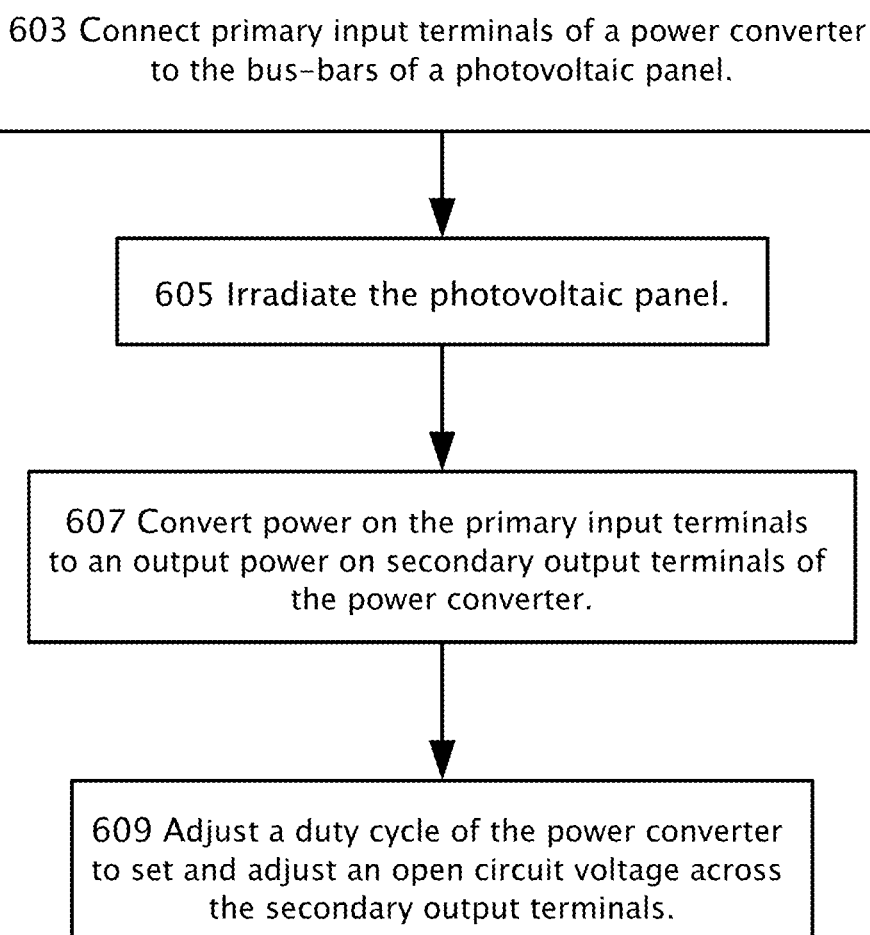
FIG. 6 shows a method according to various embodiments.

Further, as shown in FIG. 4, the series string of secondary outputs of converters 322 may be referenced to ground at various points to provide a reduced maximum voltage with respect to the ground reference of the primary side. For example, a secondary output of an intermediate converter in each string may be grounded, such that converters connected in the string on one side (e.g., the positive side) of the ground point may have a positive voltage with respect to ground, and converters connected in the string on the other side (e.g., the negative side) of the ground point have a negative voltage. In the example above, the 400V across the secondary output string can be referenced to a range of −200V to +200V with respect to the ground reference. Thus, the maximum primary to secondary side voltage difference can be reduced from 400V to 200V. Reference is now made to FIG. 6 which shows a method 601 which may be applied to system 10/10a and a junction box 103, according to an illustrative feature. Method 601 may be applied to junction box and/or panel 101, prior to making a series connection of the outputs ($V_i$) of converters 322 to form a string 107. In step 603, a single primary DC input ($V_P$) of converter 322 is connected to bus-bars a and c via terminations, which may be located in junction box 103. Where converter 103 has a dual DC input, connection may be made to bus bar b. In step 605 a panel 101 may be then irradiated to provide a voltage on the primary input ($V_P$) of converter 322. Alternatively, another DC voltage source may be connected to the primary input ($V_P$) of converter 322. With a panel 101 connected (step 603) to the primary input ($V_P$) and the panel 101 irradiated (step 605) or DC voltage applied to the primary input ($V_P$), DC power on the primary input ($V_P$) may be converted with galvanic isolation to the secondary output ($V_i$). During the conversion of power by converter 322, the duty cycle of converter 322 may be adjusted to vary and set the open circuit voltage on the secondary output ($V_i$) of converter 322 (step 609). Alternatively, the duty cycle of converter may be adjusted to vary and set the operating voltage on the secondary output ($V_i$) of converter 322 when the secondary output ($V_i$) is connected to a load and/or within a string 107.

The indefinite articles "a", "an" is used herein, such as "a photovoltaic panel", "a junction box" have the meaning of "one or more" that is "one or more photovoltaic panels" or "one or more junction boxes".

Aspects of the disclosure have been described in terms of illustrative embodiments thereof. While illustrative systems and methods as described herein embodying various aspects of the present disclosure are shown, it will be understood by those skilled in the art, that the disclosure is not limited to these embodiments. Modifications may be made by those skilled in the art, particularly in light of the foregoing teachings. For example, each of the features of the aforementioned illustrative examples may be utilized alone or in combination or sub combination with elements of the other examples. For example, any of the above described systems and methods or parts thereof may be combined with the other methods and systems or parts thereof described above. For example, one of ordinary skill in the art will appreciate that the steps illustrated in the illustrative figures may be performed in other than the recited order, and that one or more steps illustrated may be optional in accordance with aspects of the disclosure. It will also be appreciated and understood that modifications may be made without departing from the true spirit and scope of the present disclosure. The description is thus to be regarded as illustrative instead of restrictive on the present disclosure.

The invention claimed is:

1. A system comprising:
  a plurality of photovoltaic panels, wherein each photovoltaic panel of the plurality of photovoltaic panels comprises: a photovoltaic output having a first photovoltaic terminal and a second photovoltaic terminal, and a casing having a ground connection, and wherein each photovoltaic panel of the plurality of photovoltaic panels has a maximum voltage rating between the casing and the photovoltaic output; and
  a plurality of converter circuits, wherein each converter circuit of the plurality of converter circuits comprises:
    a converter input having a first converter input terminal and a second converter input terminal, wherein the first converter input terminal is connected to the first photovoltaic terminal of a corresponding photovoltaic panel of the plurality of photovoltaic panels, and wherein the second converter input terminal is connected to the second photovoltaic terminal and the casing of the corresponding photovoltaic panel; and
    a converter output having a first converter output terminal and a second converter output terminal, wherein the converter output is galvanically isolated from the converter input, and wherein the converter circuit is configured to convert a first direct current (DC) power at the converter input to a second DC power at the converter output,
    wherein converter outputs of the plurality of converter circuits are connected in series to form a series string, and
    wherein the converter output of each converter circuit of the plurality of circuits is configured to operate at a voltage that is, with respect to the ground connection, at least the maximum voltage rating, of one of the plurality of photovoltaic panels, times a quantity of the plurality of converter circuits in the series string.

2. The system of claim 1, further comprising:
  a plurality of junction boxes, wherein each junction box, of the plurality of junction boxes:
    houses a corresponding converter circuit of the plurality of converter circuits; and
    is mechanically connected to the corresponding photovoltaic panel connected to the corresponding the corresponding converter circuit.

3. The system of claim 1, wherein the casing, of each photovoltaic panel of the plurality of photovoltaic panels, comprises a conducting material.

4. The system of claim 1, wherein the each photovoltaic panel of the plurality of photovoltaic panels further comprises:
  photovoltaic cells; and
  an insulating sheet in direct contact with the photovoltaic panel, wherein the insulating sheet is disposed between the casing and the photovoltaic cells, and wherein the insulating sheet provides insulation for the photovoltaic cells to withstand the maximum voltage rating of the photovoltaic panel.

5. The system of claim 1, wherein each converter circuit of the plurality of converter circuits comprises an adjustable duty cycle.

6. The system of claim 1, wherein the maximum voltage rating of the one of the plurality of photovoltaic panels is at least greater than 40 volts,
  wherein the quantity of converter circuits in the series string is ten, and
  wherein the voltage is at least greater than 400 volts.

7. A method comprising:
  connecting a casing of each photovoltaic panel of a plurality of photovoltaic panels to a ground connection, wherein each photovoltaic panel of a plurality of photovoltaic panels comprises a photovoltaic output having a first photovoltaic terminal and a second photovoltaic terminal, and wherein each photovoltaic panel of the plurality of photovoltaic panels has a maximum voltage rating between the casing and the photovoltaic output;
  for each converter circuit, of a plurality of converter circuits, comprising a converter input having a first converter input terminal and a second converter input terminal, and a converter output having a first converter output terminal and a second converter output terminal:
    connecting the first converter input terminal to the first photovoltaic output terminal of a corresponding photovoltaic panel of the plurality of photovoltaic panels; and
    connecting the second converter input terminal to the second photovoltaic terminal and the casing of the corresponding photovoltaic panel, wherein the converter output is galvanically isolated from the converter input, and wherein the converter circuit is configured to convert a first direct current (DC) power at the converter input to a second DC power at the converter output; and
  connecting converter outputs of the plurality of converter circuits are connected in series to form a series string,
  wherein the converter output of each converter circuit of the plurality of circuits is configured to operate at a voltage that is, with respect to the ground connection, at least the maximum voltage rating, of one of the plurality of photovoltaic panels, times a quantity of the plurality of converter circuits in the series string.

8. The method of claim 7, further comprising:
inserting each converter circuit, of the plurality of converter circuits, into a corresponding junction box of a plurality of junction boxes; and
mechanically connecting the plurality of junction boxes to the plurality of photovoltaic panels.

9. The method of claim 7, wherein the casing, of each photovoltaic panel of the plurality of photovoltaic panels, comprises a conducting material.

10. The method of claim 7, further comprising:
for each photovoltaic panel of the plurality of photovoltaic panels, disposing an insulating sheet between the casing and a plurality of photovoltaic cells of the photovoltaic panel, wherein the insulating sheet provides insulation for the photovoltaic cells to withstand the maximum voltage rating of the photovoltaic panel.

11. The method of claim 7, further comprising:
adjusting a duty cycle of each converter circuit of the plurality of converter circuits.

12. A photovoltaic apparatus comprising:
a photovoltaic panel comprising a photovoltaic output having a first photovoltaic terminal and a second photovoltaic terminal, and a casing having a ground connection, wherein the photovoltaic panel has a maximum voltage rating between the photovoltaic output and the casing; and
a converter circuit comprising:
a converter input having a first converter input terminal and a second converter input terminal, wherein the first converter input terminal is connected to the first photovoltaic terminal, and wherein the second converter input terminal is connected to the second photovoltaic terminal and the casing; and
a converter output having a first converter output terminal and a second converter output terminal, wherein the converter output is galvanically isolated from the converter input, and wherein the converter circuit is configured to convert a first direct current (DC) power at the converter input to a second DC power at the converter output,
wherein the converter output is configured to operate at a voltage that is, with respect to the ground connection, at least double the maximum voltage rating of the photovoltaic panel.

13. The photovoltaic apparatus of claim 12, further comprising:
a junction box housing the converter circuit and mechanically connected to the photovoltaic panel.

14. The photovoltaic apparatus of claim 12, wherein the casing comprises a conducting material.

15. The photovoltaic apparatus of claim 12, further comprising:
an insulating sheet in direct contact with photovoltaic cells of the photovoltaic panel, wherein the insulating sheet is disposed between the casing and the photovoltaic cells, and wherein the insulating sheet provides insulation for the photovoltaic cells to withstand the maximum voltage rating of the photovoltaic panel.

16. The photovoltaic apparatus of claim 12, wherein a duty cycle of the converter circuit comprises an adjustable duty cycle.

17. The photovoltaic apparatus of claim 12, wherein the voltage is at least greater than triple of the maximum voltage rating of the photovoltaic panel.

18. The photovoltaic apparatus of claim 12, wherein the voltage is at least greater than four times the maximum voltage rating of the photovoltaic panel.

19. A method comprising:
connecting a casing of a photovoltaic panel to a ground connection, wherein the photovoltaic panel comprises a photovoltaic output having a first photovoltaic terminal and a second photovoltaic terminal, and wherein the photovoltaic panel has a maximum voltage rating between the photovoltaic output and the casing; and
for a converter circuit comprising a converter input having a first converter input terminal and a second converter input terminal, and a converter output having a first converter output terminal and a second converter output terminal:
connecting the first converter input terminal to the first photovoltaic terminal; and
connecting the second converter input terminal to the second photovoltaic output terminal and the casing,
wherein the converter output is galvanically isolated from the converter input, and
wherein the converter output is configured to operate at a voltage that is, with respect to the ground connection, at least double the maximum voltage rating.

20. The method of claim 19, further comprising:
incorporating the converter circuit into a junction box; and
mechanically connecting the junction box to the photovoltaic panel.

21. The method of claim 19, wherein the casing comprises a conducting material.

22. The method of claim 19, further comprising:
disposing an insulating sheet between the casing and photovoltaic cells of the photovoltaic panel, wherein the insulating sheet provides a level of insulation for the photovoltaic cells to withstand the maximum voltage rating of the photovoltaic panel.

23. The method of claim 19, further comprising:
adjusting a duty cycle of the converter circuit.

* * * * *